(12) United States Patent
Fest

(10) Patent No.: US 9,269,606 B2
(45) Date of Patent: Feb. 23, 2016

(54) SPACER ENABLED ACTIVE ISOLATION FOR AN INTEGRATED CIRCUIT DEVICE

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/184,177

(22) Filed: Feb. 19, 2014

(65) Prior Publication Data
US 2015/0235895 A1      Aug. 20, 2015

(51) Int. Cl.
| H01L 21/762 | (2006.01) |
| H01L 21/308 | (2006.01) |
| H01L 21/3105 | (2006.01) |
| H01L 21/76 | (2006.01) |
| H01L 21/31 | (2006.01) |

(52) U.S. Cl.
CPC ........ *H01L 21/76224* (2013.01); *H01L 21/308* (2013.01); *H01L 21/3081* (2013.01); *H01L 21/3085* (2013.01); *H01L 21/3088* (2013.01); *H01L 21/31* (2013.01); *H01L 21/31053* (2013.01); *H01L 21/76* (2013.01)

(58) Field of Classification Search
CPC . H01L 21/76; H01L 21/76224; H01L 21/308; H01L 21/3081; H01L 21/3083; H01L 21/3085; H01L 21/31; H01L 21/31053
See application file for complete search history.

(56) References Cited

U.S. PATENT DOCUMENTS

| 5,790,455 A | 8/1998 | Caywood ................. 635/185.06 |
| 5,962,872 A | 10/1999 | Zhang et al. ................. 257/66 |
| 5,986,931 A | 11/1999 | Caywood ................. 365/185.06 |
| 6,031,287 A | 2/2000 | Harshfield et al. ............ 257/734 |
| 6,147,395 A | 11/2000 | Gilgen ......................... 257/529 |
| 2002/0036931 A1 | 3/2002 | Lowrey et al. ................ 365/200 |

(Continued)

FOREIGN PATENT DOCUMENTS

| CN | 102130145 A | 7/2011 | ............. H01L 27/24 |
| DE | 102007049786 A1 | 4/2009 | ............. H01L 27/24 |

(Continued)

OTHER PUBLICATIONS

International Search Report and Written Opinion, Application No. PCT/US2014/019868, 10 pages, Jun. 5, 2014.

(Continued)

*Primary Examiner* — Thanhha Pham
(74) *Attorney, Agent, or Firm* — Slayden Grubert Beard PLLC

(57) ABSTRACT

A method for forming an active isolation structure in a semiconductor integrated circuit die is disclosed. A first hard mask layer is deposited over a semiconductor substrate. Portions of the first hard mask layer are removed to form at least one trench. A spacer layer is deposited over the first hard mask and extends into each trench to cover exposed portions of the semiconductor substrate surface in each trench. Portions of the spacer layer are removed such that remaining portions define spacer layer walls covering the side walls of each trench. A second hard mask layer is deposited and extends into each trench between opposing spacer layer walls. The spacer layer walls are removed such that remaining portions of the first and second hard mask layers define a mask pattern, which is then transferred to the substrate to form openings in the substrate, which are filled with an isolation material.

14 Claims, 5 Drawing Sheets

(56) References Cited

U.S. PATENT DOCUMENTS

| | | | |
|---|---|---|---|
| 2002/0039306 A1 | 4/2002 | Lowrey | 365/100 |
| 2004/0192009 A1* | 9/2004 | Belyansky et al. | 438/424 |
| 2005/0029505 A1 | 2/2005 | Lowrey | 257/5 |
| 2006/0006443 A1 | 1/2006 | Lowrey et al. | 257/296 |
| 2006/0097238 A1 | 5/2006 | Breuil et al. | 257/4 |
| 2007/0097738 A1 | 5/2007 | Asano et al. | 365/163 |
| 2007/0267618 A1 | 11/2007 | Zaidi et al. | 257/2 |
| 2008/0012079 A1 | 1/2008 | Zaidi | 257/379 |
| 2009/0017591 A1 | 1/2009 | Cervin-lawry et al. | 438/384 |
| 2009/0026438 A1 | 1/2009 | Lin | 257/4 |
| 2009/0096568 A1 | 4/2009 | Hosoi et al. | 338/20 |
| 2009/0200640 A1 | 8/2009 | Hosoi et al. | 257/536 |
| 2010/0019218 A1 | 1/2010 | Chung | 257/4 |
| 2010/0252798 A1 | 2/2010 | Baker et al. | 206/503 |
| 2010/0084741 A1 | 4/2010 | Andres et al. | 257/536 |
| 2010/0163829 A1 | 7/2010 | Wang et al. | 257/3 |
| 2010/0193762 A1 | 8/2010 | Hsieh et al. | 257/4 |
| 2010/0264396 A1 | 10/2010 | Lung et al. | 257/3 |
| 2011/0180775 A1 | 7/2011 | Lin et al. | 257/4 |
| 2011/0291064 A1 | 12/2011 | Marsh et al. | 257/4 |
| 2012/0294065 A1 | 11/2012 | Hong et al. | 365/148 |
| 2012/0313071 A1 | 12/2012 | Gopalan | 257/4 |
| 2012/0319072 A1 | 12/2012 | Wei et al. | 257/4 |
| 2013/0001501 A1 | 1/2013 | Sills | 257/4 |
| 2013/0112936 A1 | 5/2013 | Wei et al. | 257/4 |
| 2013/0214234 A1 | 8/2013 | Gopalan et al. | 257/3 |
| 2013/0252431 A1* | 9/2013 | Chen et al. | 438/702 |
| 2013/0336046 A1 | 12/2013 | Oh | 365/163 |

FOREIGN PATENT DOCUMENTS

| | | | | |
|---|---|---|---|---|
| EP | 1355365 A2 | 10/2003 | | H01L 27/10 |
| EP | 2202816 A1 | 6/2010 | | H01L 27/24 |
| EP | 2267775 A2 | 12/2010 | | G11C 16/04 |
| EP | 2339585 A1 | 6/2011 | | G11C 16/00 |
| WO | 2012/057772 A1 | 5/2012 | | H01L 21/8247 |
| WO | 2012/167286 A1 | 12/2012 | | G11C 11/34 |
| WO | 2014/164015 A1 | 10/2014 | | H01L 45/00 |

OTHER PUBLICATIONS

International Search Report and Written Opinion, Application No. PCT/US2014/019906, 12 pages, Jul. 2, 2014.
Kozicki, M., "Nanoscale Memory Elements Based on Solid-State Electrolytes," IEEE Transactions on Nano Technology, vol. 4, No. 3, 8 pages, May 2005.
Chen, A., "Non-Volatile Resistive Switching for Advanced Memory Applications," IEDM Technical Digest, 4 pages, 2005.
Balakrishnan, M. et al., "A Low Power Non-Volatile Memory Element Based on Copper in Deposited Silicon Oxide," Non-Volatile Memory Technology Symposium, 7 pages, 2006.
Schindler, C. et al., "Bipolar and Unipolar Resistive Switching in CU-Doped SiO2," IEEE Transactions on Electron Devices, vol. 54, No. 10, 7 pages, 2007.
Chen, A., "Ionic Memories: Status and Challenges," Non-Volatile Memory Technology Symposium, 5 pages, 2008.
Valov, I. et al., "Electrochemical Metallization Memories—Fundamentals, Applications, Prospects," Nanotechnology, vol. 22, No. 25, 22 pages, Jun. 24, 2011.
Jou, S. et al., "Resistance Switching Properties in Cu/Cu—SiO2/TaN Device," Proceeding World Congress on Engineering, vol. 2, 4 pages, Jul. 6, 2011.
Yang, L. et al., "Linear Scaling of Reset Current Down to 22-nm Node for a Novel CuxSiyO RRAM," IEEE Electron Device Letters, vol. 33, No. 1, 3 pages, 2012.
International Search Report and Written Opinion, Application No. PCT/US2015/016268, 9 pages, May 4, 2015.
International Search Report and Written Opinion, Application No. PCT/US2014/020188, 10 pages, May 13, 2014.
International Search Report and Written Opinion, Application No. PCT/US2014/022194, 11 pages, May 16, 2014.
International Search Report and Written Opinion, Application No. PCT/US2015/016259, 16 pages, May 6, 2015.
International Search Report and Written Opinion, Application No. PCT/US2015/016244, 11 pages, May 7, 2015.
International Search Report and Written Opinion, Application No. PCT/US2015/016321, 11 pages, Jul. 14, 2015.
U.S. Non-Final Office Action, U.S. Appl. No. 14/183,792, 23 pages, Jul. 8, 2015.
U.S. Non-Final Office Action, U.S. Appl. No. 14/183,674, 26 pages, Jul. 8, 2015.
U.S. Non-Final Office Action, U.S. Appl. No. 14/183,831, 18 pages, Jul. 9, 2015.
U.S. Non-Final Office Action, U.S. Appl. No. 14/183,738, 26 pages, Jul. 16, 2015.
U.S. Non-Final Office Action, U.S. Appl. No. 14/183,953, 27 pages, Jul. 31, 2015.
U.S. Final Office Action, U.S. Appl. No. 14/184,331, 10 pages, Nov. 12, 2015.
U.S. Final Office Action, U.S. Appl. No. 14/184,034, 29 pages, Dec. 16, 2015.

* cited by examiner

SPACER ENABLED ACTIVE ISOLATION FOR AN INTEGRATED CIRCUIT DEVICE

TECHNICAL FIELD

The present disclosure relates to semiconductor integrated circuit (IC) fabrication, and more particularly, to forming sub-lithographic active isolation structures in a semiconductor die (e.g., integrated circuit die) during fabrication thereof.

BACKGROUND

Reduction in the size of active isolation structures in a semiconductor die, e.g., for locating transistors and/or other circuit elements, has typically been limited by the lithographic processes available. As the size of transistors has decreased and the density of transistors on the semiconductor die has increased due to improvements in lithographic fabrication processes, active isolation structures for locating these transistors have been unable to decrease proportionally in size with the smaller and/or more densely populated transistors.

SUMMARY

Therefore, there is need for a way to decrease the size of active isolation structures, e.g., beyond the typical limitations of the lithographic processes available for manufacturing semiconductor integrated circuits.

According to the teachings of this disclosure, active isolation structures can be formed by a process including a spacer layer or film. Such process may enable active isolation scaling well below current photolithographic capabilities. For example, the disclosed process for forming isolation structures may double the active isolation patterning for a given photolithography pattern by using a sacrificial spacer layer or film to line the walls of trenches in a hard mask material. The gap between the spacer film side walls may be filled and subjected to a CMP process to expose top surfaces of the spacer film side walls such that the spacer film side walls may be removed, thereby leaving two channels within the same trench, which channels may then be patterned into the underlying substrate and filled to form two isolation regions.

In one embodiment, a method for forming an active isolation structure in a semiconductor integrated circuit die may include: depositing a first hard mask layer on a surface of a semiconductor substrate; removing portions of the first hard mask layer to form at least one trench, each trench defining walls and an open bottom exposing the semiconductor substrate surface; depositing a spacer layer over the first hard mask and extending into each trench to cover the exposed semiconductor substrate surface in each trench; removing portions of the spacer layer, including portions of the spacer layer covering the exposed semiconductor substrate surface in each trench, such that remaining portions of the spacer layer define spacer layer walls covering the walls of each trench; depositing a second hard mask layer extending into each trench between opposing spacer layer walls in each respective trench; removing the spacer layer walls such that remaining portions of the first and second hard mask layers define a mask pattern; transferring the mask pattern to the substrate by removing portions of the substrate to form openings in the substrate; and filling the openings in the substrate with an isolation material.

In another embodiment, a semiconductor die may include a semiconductor substrate and an active isolation structure formed in the semiconductor substrate by a process including: depositing a first hard mask layer on a surface of the semiconductor substrate; removing portions of the first hard mask layer to form at least one trench, each trench defining walls and an open bottom exposing the semiconductor substrate surface; depositing a spacer layer over the first hard mask and extending into each trench to cover the exposed semiconductor substrate surface in each trench; removing portions of the spacer layer, including portions of the spacer layer covering the exposed semiconductor substrate surface in each trench, such that remaining portions of the spacer layer define spacer layer walls covering the walls of each trench; depositing a second hard mask layer extending into each trench between opposing spacer layer walls in each respective trench; removing the spacer layer walls such that remaining portions of the first and second hard mask layers define a mask pattern; transferring the mask pattern to the substrate by removing portions of the substrate to form openings in the substrate; and filling the openings in the substrate with an isolation material.

In other embodiments, a semiconductor die includes a semiconductor substrate and, an active isolation structure formed in the semiconductor substrate and having a thickness of less than 1000 nm. In some embodiments, the thickness of the active isolation structure less than 100 nm, or even less than 15 nm.

BRIEF DESCRIPTION OF THE FIGURES

Example embodiments are discussed below with reference to the drawings, in which.

DETAILED DESCRIPTION

Figure 1:
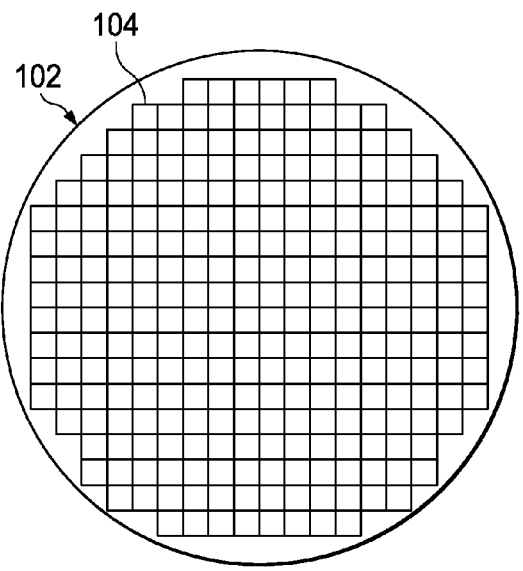
FIG. 1 illustrates a schematic plan view diagram of a semiconductor integrated circuit wafer comprising a plurality of semiconductor dice.

According to the teachings of this disclosure, active isolation structures can be formed by a process including a spacer layer or film. Such process may enable active isolation scaling well below current photolithographic capabilities, as discussed below.

Referring now to the drawings, the details of specific example embodiments are schematically illustrated. Like elements in the drawings will be represented by like numbers, and similar elements will be represented by like numbers with a different lower case letter suffix.

FIG. 1 shows a schematic plan view diagram of a semiconductor integrated circuit wafer comprising a plurality of semiconductor dice. A silicon wafer 102 may be scribed into a plurality of semiconductor dice 104 for further processing to create planar transistors, diodes and conductors on each of the plurality of semiconductor dice 104. After all circuits have been fabricated on the plurality of semiconductor dice 104, the dice 104 are singulated (separated) and packaged into integrated circuits (not shown).

FIGS. 2A-2K illustrate an example method for forming active isolation regions in substrate of a semiconductor integrated circuit die (e.g., die 104 shown in FIG. 1), according to one embodiment of the present invention. The active isolation regions may have sub-lithographic dimensions (e.g., a sub-lithographic thickness).

Figure 2A:
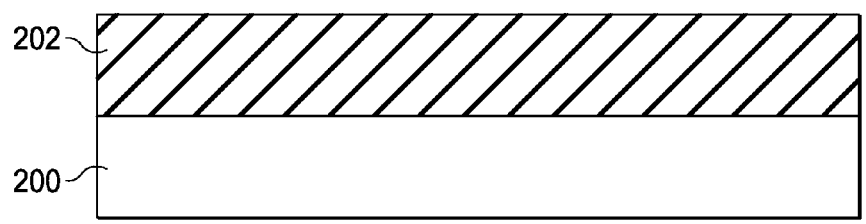
FIGS. 2A-2K illustrate an example method for forming active isolation regions in substrate of a semiconductor integrated circuit die, according to one embodiment of the present invention.
Figure 2B:
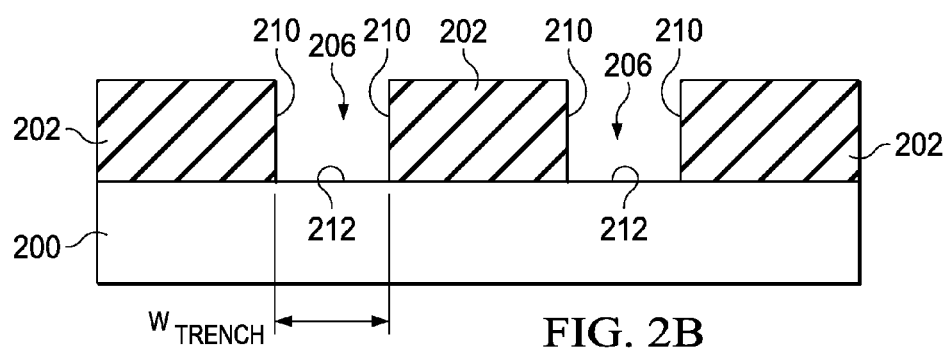

As shown in FIG. 2A, a first active hard mask layer 202 is formed over a semiconductor substrate 200. Semiconductor substrate 200 may comprise any suitable material, e.g., silicon. Likewise, hard mask layer 202 may comprise any suitable material or materials (e.g., SiN, SiON, or other dielectric material) and may be formed in using any suitable technique. Next, as shown in FIG. 2B, portions of the first hard mask layer 202 are removed, e.g., by an etch process, to form at least one trench 206. Each trench 206 may define one or more side walls 210 and an open bottom exposing the upper surface 212 of the semiconductor substrate 200.

Each trench 206 may have any suitable shape. For example, a perimeter (e.g., as viewed from above, such as in FIG. 3) each trench 206 may have an elongated rectangular shape, a square shape, a circular, oval, or otherwise rounded shape, or any other suitable shape. In addition, each trench 206 may have any suitable dimensions. For example, each trench 206 may have a width $w_{trench}$ suitable to provide a resulting active island (e.g., active island 280 shown in FIG. 3) that is suitably size for locating transistors or other circuit structures. For example, each trench 206 may have a width $w_{trench}$ of between 20 nm and 20,000 nm. In some embodiments, the $w_{trench}$ of each trench 206 is between 20 nm and 2,000 nm. In particular embodiments, the $w_{trench}$ of each trench 206 is between 20 nm and 500 nm.

Figure 2C:
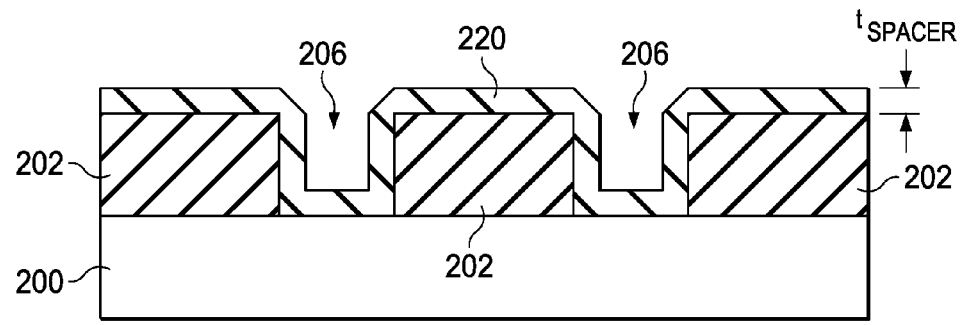

Next, as shown in FIG. 2C, a sacrificial spacer layer or film 220 is formed over the first hard mask 202 and extends into each trench 206 to cover the exposed semiconductor substrate surface 212 in each trench 206. The sacrificial spacer layer 220 may comprise any suitable material or materials (e.g., $SiO_2$ or other dielectric material) and may be formed in using any suitable technique. As will be understood in view of the following process steps, the thickness of the sacrificial spacer layer or film 220 may substantially define the width of resulting active isolation regions formed in the substrate 200 (e.g., active isolation regions 272 shown in FIGS. 2K and 3). Thus, in some embodiments, the sacrificial spacer layer 220 may be relatively or very thin, to provide a relatively or very thin or narrow active isolation layers. For example, sacrificial spacer layer 220 may have a thickness $t_{spacer}$ of less than 5000 nm, less than 1000 nm, or less than 100 nm. In some example embodiments, the thickness $t_{spacer}$ of sacrificial spacer layer 220 is between 10 nm and 1000 nm. In particular embodiments, the thickness $t_{spacer}$ of sacrificial spacer layer 220 is between 10 nm and 100 nm.

Figure 2D:
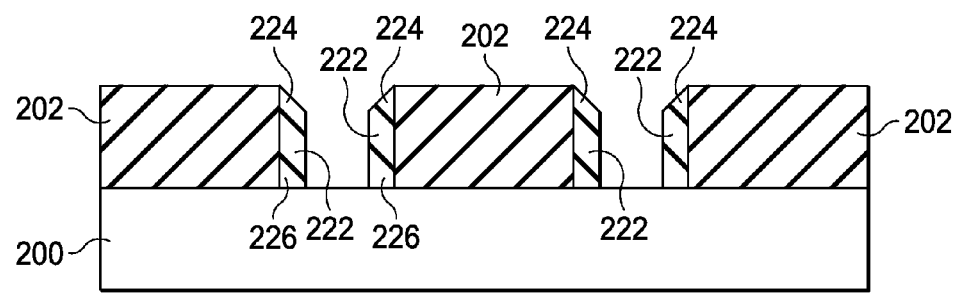

Next, as shown in FIG. 2D, portions of the sacrificial spacer layer 220, including portions covering the exposed semiconductor substrate surface 212 in each trench 206, are removed, e.g., by an etch process, such that remaining portions of the sacrificial spacer layer 220 define spacer layer side walls 222 covering the side walls 210 of each trench 206. As shown, rounding or angling may occur at the top of each spacer layer side wall 222, thus defining a rounded, angled, or tapered region 224 above a more uniform region 226 of each spacer layer side wall 222.

Figure 2E:
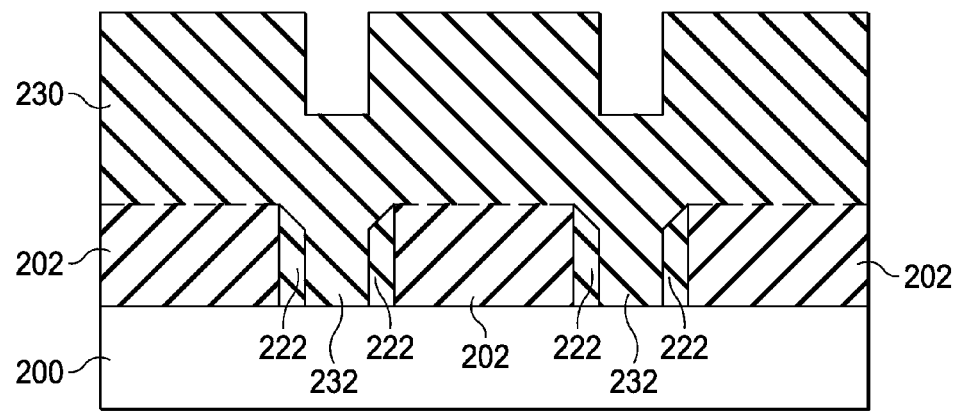

Next, as shown in FIG. 2E, a second hard mask layer 230 is formed over the structure and extends into the gaps 232 between opposing spacer layer side walls 222 in each respective trench 206. Second hard mask layer 230 may comprise any suitable material or materials (e.g., SiN, SiON, or other dielectric material) and may be formed in using any suitable technique. In some embodiments, second hard mask layer 230 comprises the same material as first hard mask layer 202.

In other embodiments, first and second hard mask layers 202 and 230 comprise different materials.

Figure 2F:
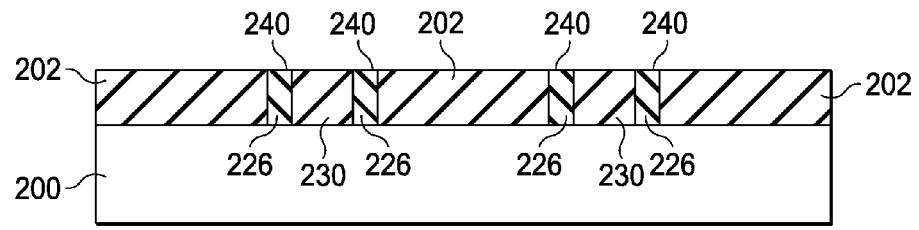

Next, as shown in FIG. 2F, portions of second hard mask layer 230, along with the rounded, angled, or tapered regions 224 at the upper side of each spacer layer side wall 222, are removed in any suitable manner, such that upper surfaces 240 of the remaining spacer layer side walls 222. In some embodiments, e.g., as shown in FIGURE, the material removal process may extend through the angled, or tapered regions 224 to expose an upper surface 240 of the underlying uniform region 226 of each spacer layer side wall 222. In some embodiments, the material removal process comprises a chemical-mechanical planarization (CMP) process.

Figure 2G:
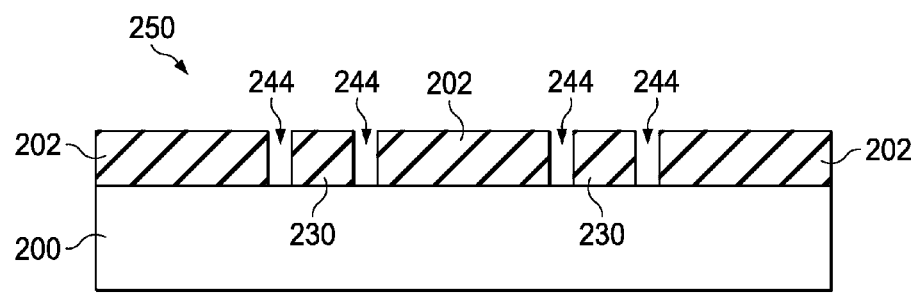

Next, as shown in FIG. 2G, the portions of spacer layer side wall 222 remaining after the material removal process (e.g., CMP process)—in this embodiment, spacer layer side wall regions 226—are removed using any suitable technique, e.g., a dip-out process. Thus, good selectively between the spacer layer material and the hard mask material(s) may be desirable. The remaining portions of the first and second hard mask layers 202 and 230 define a mask pattern 250 around the openings 244 formed by the removal of the spacer layer side wall regions 226.

Figure 2H:
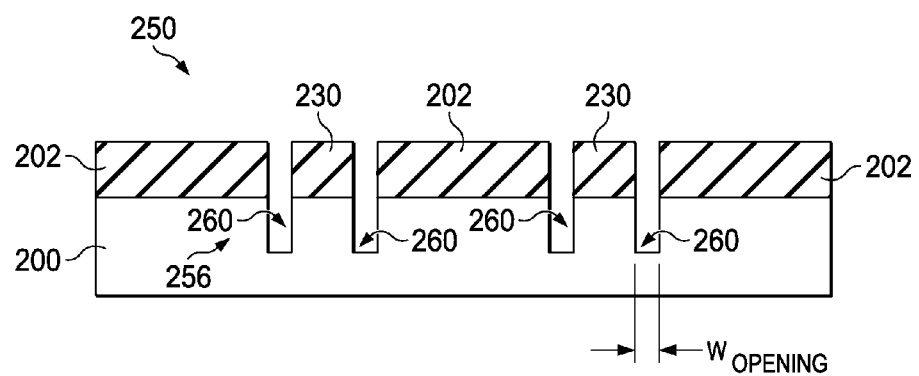

Next, as shown in FIG. 2H, an etch process or other suitable material removal process is performed to transfer the mask pattern 250 into the substrate 200, thereby forming a corresponding pattern 256 of openings 260 in the substrate 200, with each opening corresponding to a previously-removed spacer layer side wall 222. The bottom of each opening 260 may have a generally rounded shape resulting from the etch process, or a generally squared off shape as shown in FIG. 2H.

Due to the process discussed above, the width of each opening, indicated as $W_{opening}$, may be substantially equal to (e.g., within 20%), or at least dependent on, the thickness $t_{spacer}$ of sacrificial spacer layer 220. In some embodiments, the width $W_{opening}$ of one or more openings 260 may be smaller than can be formed by current photolithographic capabilities (e.g., using current photoresist patterning techniques). For example, in some embodiments, the width $W_{opening}$ of one or more openings 260 may be less than 1000 nm, less than 100 nm, or even less than 15 nm. In some example embodiments, the width $W_{opening}$ of one or more openings 260 is between 5 nm and 1000 nm. In particular embodiments, the width $W_{opening}$ of one or more openings 260 is between 5 nm and 100 nm.

Figure 2I:
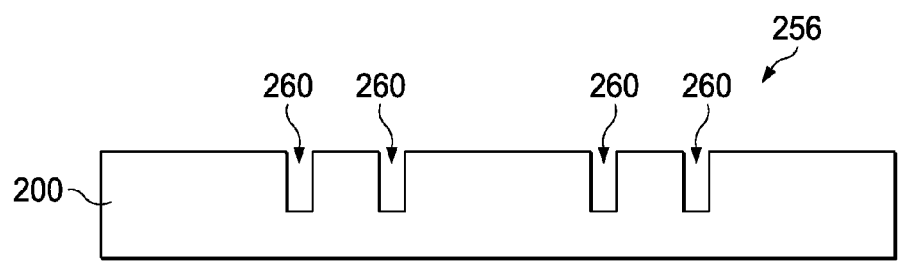

Next, as shown in FIG. 2I, the remaining regions of first and second hard mask layers 202 and 230 are removed using any suitable technique, e.g., a stripping or etching process, thereby exposing the underlying substrate 200 having the pattern 256 of openings 260 formed therein.

Figure 2J:
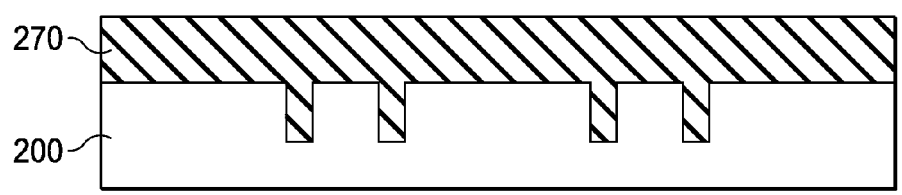

Next, as shown in FIG. 2J, an isolation fill is performed to deposit isolation material 270 over substrate 200 and extending into openings 260. The isolation material may comprise a dielectric (e.g., $SiO_2$) or any other suitable isolation material.

Figure 2K:
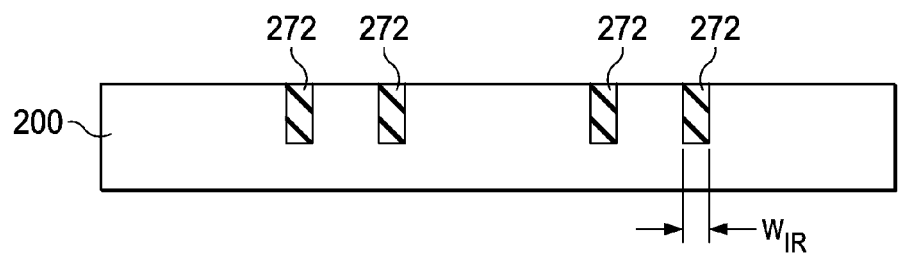

Next, as shown in FIG. 2K, portions of the isolation material 270 are removed in any suitable manner, e.g., using a CMP process, thereby providing a pattern of active isolation regions 272 in the substrate 200. Due to the process discussed above, the width of each isolation region 272, indicated as $W_{IR}$, may be equal to the width $W_{opening}$ of the corresponding opening 260 forming the substrate 200 at the step shown in FIG. 2H, and thus substantially equal to (e.g., within 20%), or at least dependent on, the thickness $t_{spacer}$ of sacrificial spacer layer 220. Thus, in some embodiments, the width $W_{IR}$ of one or more isolation region 272 may be smaller than can be formed by current photolithographic capabilities (e.g., using current photoresist patterning techniques). For example, in some embodiments, the width $W_{IR}$ of one or more isolation region 272 may be less than 1000 nm, less than 100 nm, or even less than 15 nm. In some example embodiments, the width $W_{IR}$ of one or more isolation region 272 is between 5 nm and 1000 nm. In particular embodiments, the width $W_{IR}$ of one or more isolation region 272 is between 5 nm and 100 nm.

Figure 3:
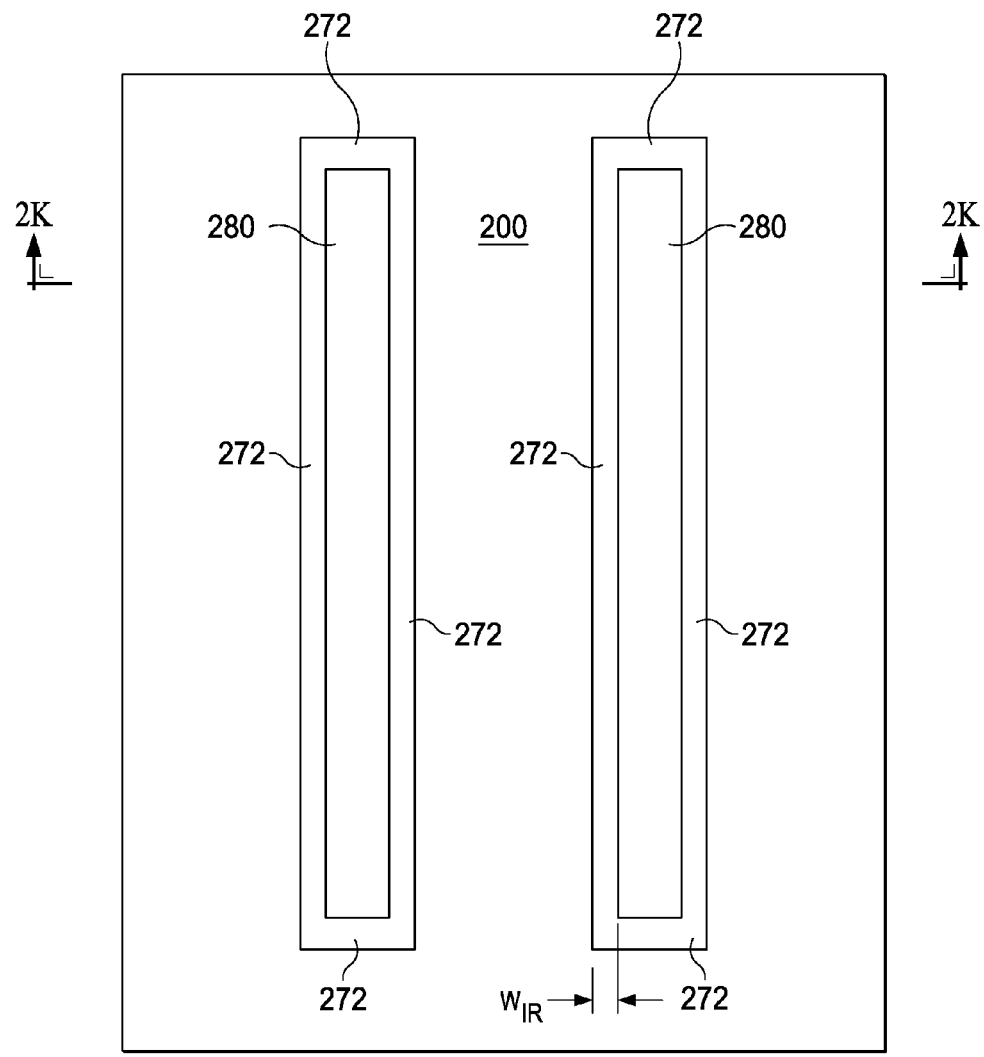
FIG. 3 illustrates a top view of a pair of active islands defined by isolation regions formed according to the example method of FIGS. 2A-2K, according to one example embodiment.

FIG. 3 illustrates a top view of a pair of isolated active islands 280 defined by isolation regions 272 formed according to the example method of FIGS. 2A-2K, according to one example embodiment. A cross-section line 2K-2K is shown, which corresponds to the view of FIG. 2K. In this example embodiment, each active islands 280 is defined by an elongated rectangular perimeter of isolation regions 272, which may result from elongated rectangular trenches 206 formed in the step shown in FIG. 2B. In other embodiments, active islands 280 may be formed with any other suitable perimeter shape, e.g., a square shape, a circular, oval, or otherwise rounded shape, or any other suitable shape, based on the shape of trenches 206 formed as discussed above.

Thus, in the manner disclosed above, active isolation structures can be formed by a process including a spacer layer or film. Such process may enable active isolation scaling well below current photolithographic capabilities, which may provide various advantages as would be understood by one of ordinary skill in the art.

Although the disclosed embodiments are described in detail in the present disclosure, it should be understood that various changes, substitutions and alterations can be made to the embodiments without departing from their spirit and scope.

The invention claimed is:

1. A method for forming an active isolation structure in a semiconductor integrated circuit die, the method comprising:
   depositing a first hard mask layer on a surface of a semiconductor substrate;
   removing portions of the first hard mask layer to form at least one trench, each trench defining side walls and an open bottom exposing the semiconductor substrate surface;
   depositing a spacer layer over the first hard mask and extending into each said trench to cover the exposed semiconductor substrate surface in each said trench;
   removing portions of the spacer layer, including portions of the spacer layer covering the exposed semiconductor substrate surface in each said trench, such that remaining portions of the spacer layer define spacer layer side walls covering the side walls of each said trench, the spacer layer side walls having upper, rounded portions;
   depositing a second hard mask layer extending into each trench between opposing spacer layer side walls in each respective trench;
   after depositing the second hard mask layer, performing a material removal process that removes (a) upper portions of the first hard mask layer, (b) upper portions of the second hard mask layer, and (c) the upper, rounded portions of the spacer layer side walls to expose lower, non-rounded surfaces of the spacer layer side walls;
   after performing the material removal process, removing the spacer layer side walls such that remaining portions of the first and second hard mask layers define a mask pattern;
   transferring the mask pattern to the semiconductor substrate by removing portions of the semiconductor substrate to form openings in the semiconductor substrate; and
   filling the openings in the semiconductor substrate with an isolation material.

2. The method according to claim 1, wherein:
   filling the openings in the semiconductor substrate with an isolation material comprises depositing the isolation material over the semiconductor substrate and extending into the openings in the semiconductor substrate; and
   the method further comprises removing portions of the isolation material outside the openings in the semiconductor substrate such that each isolation material-filled opening defines an active isolation region in the semiconductor substrate.

3. The method according to claim 1, wherein removing the spacer layer side walls exposes underlying portions of the semiconductor substrate surface between the remaining portions of the first and second hard mask layers that define the mask pattern.

4. The method according to claim 1, further comprising removing the remaining portions of the first and second hard mask layers after transferring the mask pattern to the semiconductor substrate and prior to filling the openings in the semiconductor substrate with the isolation material.

5. The method according to claim 1, wherein the first hard mask layer and the second hard mask layer comprise the same material.

6. The method according to claim 1, wherein at least one spacer layer side wall has a thickness of less than 1000 nm.

7. The method according to claim 1, wherein at least one spacer layer side wall has a thickness of between 15 nm and 100 nm.

8. The method according to claim 1, wherein at least one of the openings formed in the semiconductor substrate by transferring the mask pattern to the semiconductor substrate has a thickness of less than 1000 nm.

9. The method according to claim 1, wherein at least one of the openings formed in the semiconductor substrate by transferring the mask pattern to the semiconductor substrate has a thickness of between 5 nm and 100 nm.

10. The method according to claim 1, wherein removing portions of the first hard mask layer to form at least one trench comprises removing portions of the first hard mask layer to form at least one trench having a rectangular perimeter.

11. The method according to claim 1, wherein removing portions of the first hard mask layer to form at least one trench comprises removing portions of the first hard mask layer to form at least one trench having a circular or rounded perimeter.

12. The method according to claim 1, wherein the spacer layer comprises a dielectric.

13. The method according to claim 1, wherein the isolation material comprises a dielectric.

14. The method according to claim 1, wherein the spacer layer and the isolation material comprises the same material.

* * * * *